United States Patent [19]
Kobayashi et al.

[11] Patent Number: 5,723,237
[45] Date of Patent: Mar. 3, 1998

[54] METHOD FOR DETERMINING BAKING CONDITIONS FOR RESIST PATTERN FORMATION THROUGH DEVELOPMENT OF UNEXPOSED TRIAL RESIST FILMS

[75] Inventors: Hideo Kobayashi; Keishi Asakawa; Yasunori Yokoya, all of Yamanashi, Japan

[73] Assignee: Hoya Corporation, Tokyo, Japan

[21] Appl. No.: 707,487

[22] Filed: Sep. 19, 1996

[30] Foreign Application Priority Data

Sep. 19, 1995 [JP] Japan .................... 7-264726

[51] Int. Cl.⁶ .................................................. G03C 5/00
[52] U.S. Cl. ..................... 430/30; 430/327; 430/330; 437/248; 34/497
[58] Field of Search ................. 430/30, 327, 330; 437/247, 248; 34/497

*Primary Examiner*—Christopher G. Young
*Attorney, Agent, or Firm*—Sughrue, Mion, Zinn, Macpeak & Seas, PLLC

[57] ABSTRACT

Resist patterns which minimize the standard deviations of critical dimensions within a plate and between the plates (namely which minimize the critical dimensions) are formed by a method for determining conditions for resist pattern formation comprising a resist film forming process, a resist film baking process, an exposing process, and a developing process, which method consists in preparing a plurality of plates each having a resist film formed thereon, baking the resist films on the plates under severally varying baking conditions, omitting to perform an exposing treatment on the resist films, and subjecting the resist films baked under their own baking conditions to a dissolving treatment to be severally performed under such prescribed conditions as induce partial dissolution of the resist films thereby determining as the temperature condition for baking a prospective resist film the baking temperature that minimizes the change in the uniformity of the remaining resist thickness in the plates relative to the change in the baking time among the resist films and, at the same time, determining as the time conditions for baking the prospective resist film the baking time that optimizes the uniformity in the plates of the remaining resist thickness of the resist films or minimizes the amount of reducing thickness at the baking temperature.

23 Claims, 5 Drawing Sheets

METHOD FOR DETERMINING BAKING CONDITIONS FOR RESIST PATTERN FORMATION THROUGH DEVELOPMENT OF UNEXPOSED TRIAL RESIST FILMS

BACKGROUND OF THE INVENTION

This invention relates to a method for determining the conditions for resist pattern formation which determines such conditions of treatments as the condition for baking a resist film and the condition for cooling the baked resist film in a process for forming resist patterns on a plate during the microscopic patterning operation and a method for forming resist patterns by the use of the method mentioned above.

The production of a LSI or a photomask/reticle requires a microscopic patterning operation resorting to the photolithographic technique. During the course of this microscopic patterning operation, a resist pattern which is intended as a mask for etching is formed.

The process for forming resist patterns consists of a resist coating process, a resist film baking process, a resist film cooling process, an exposing process, and a developing process.

Specifically, a resist is coated in a prescribed thickness on a plate under treatment as by the spin coating technique, for example. Then, for the purpose of removing by transpiration the solvent remaining in the resist film, the plate with the resist film is set in an oven or on a hot plate and the resist film is baked at a temperature for a time duration which are both specified in conformity with the kind of the resist. After the resist film has been baked, the plate with the resist film is left spontaneously cooling in a clean open air until room temperature. Then, the plate with the resist film is selectively exposed to a prescribed dosage of an electromagnetic wave (such as, for example, ultraviolet light, x ray, or laser beam) of a wavelength zone or a particle beam (such as, for example, electron beam or charged particle beam) of an energy to be prescribed in conformity with the kind of the resist. Thereafter, the developing treatment is performed to remove the resist in the exposed area or unexposed area on the resist film and form a resist pattern aimed at.

Incidentally, the characteristics of the resist pattern such as, for example, the dosage to be required for patterning, the shape quality of the resist pattern to be obtained, the CD (critical dimension) uniformity of the resist pattern, and the adhesion property between the resist film and the underlying plate are markedly varied by the baking conditions (such as, for example, temperature, time, and method of baking) and the developing conditions (such as, for example, temperature, time, method for supply of the developer, and amount of the developer to be supplied). The baking conditions and the developing conditions, therefore, constitute themselves important factors for the formation of a resist pattern with high accuracy. Thus, these conditions must be determined with deliberation.

Generally, the determination of the baking conditions or the developing conditions is implemented by exposing a given resist to a pattern with the aid of radiation thereby actually forming the pattern and evaluating the produced pattern. In other words, the question which of the baking conditions or developing conditions is optimum is judged by the quality of the pattern to be finally obtained. The procedure which consists of baking a resist, exposing the baked resist to a pattern, and evaluating the produced pattern, therefore, forms an indispensable measure.

Since the quality of the pattern which is finally obtained serves as the criterion for the judgment under discussion, it is necessary to find the exposing condition, the developing condition, and the other conditions which can produce the best pattern with respect to the baking conditions or the developing condition and then proceed to form the pattern and evaluate the produced pattern.

For, the question whether the quality of the pattern is attributed to the baking conditions or developing conditions to be determined or to some other conditions would not be judged otherwise. As a result, each of the baking conditions or developing conditions automatically determines the other conditions. For the determination of the baking condition, for example, the optimum baking conditions are to be picked out of several baking conditions while the developing conditions are fixed in advance. Then, the optimum exposure conditions are sought out and the exposure to pattern and the development are carried out under the optimum exposure condition to produce a pattern and the produced pattern is evaluated. As a result, the exposing conditions are automatically determined. In this case, even the developing condition to be fixed in advance ought to be such as suits the formation of a good pattern. It cannot be so set that the degree of dissolution of the resist will markedly exceed an appropriate range.

Heretofore, a method which is capable of freely selecting the developing condition and the other conditions for the purpose of amply magnifying the difference in quality of patterns that depends on the difference in the baking condition so as to facilitate the judgment of this difference has never been adopted.

Owing to the true state of affairs mentioned above, it has never been always easy to determine the optimum conditions when the difference in quality of patterns due to the difference in the baking conditions or the developing conditions does not manifest very conspicuously, depending on the kind of resist or when the difference in quality of patterns under mutually different baking conditions is made to disappear by varying the developing condition or the exposure condition.

Specifically, the extent and degree of the difference in quality of patterns which depend on the difference in the baking condition, namely the sensitivity of discernment, have their own limits and, at the same time, the quality of pattern does not necessarily depend solely on the baking conditions or developing conditions to be selected but depends to a hardly ignorable extent on the combination of such conditions as mentioned above with the exposing condition. When the evaluation of a resist pattern which is formed under the conditions determined at all as described above happens to produce a defective result, the possibility arises that the question whether the failure has been caused by the baking conditions, the dosage of the electromagnetic wave used for irradiation, or the developing conditions will not be necessarily discriminated definitely. Even when the evaluation of the resist pattern produces a satisfactory result, the possibility still arises that the conditions involved will not be necessarily judged as optimum for the formation of the resist pattern.

The present inventors have pursued a diligent study in view particularly of the point just mentioned and have consequently perfected a method for determining the conditions for resist pattern formation which permits the optimum baking condition or developing conditions for resist pattern to be easily determined independently of each other through a simple process without relying on the exposing conditions. They already applied the invention covering this method for patent (JP-A-07-66,112).

This method for determining the conditions for resist pattern formation uses a procedure which comprises preparing a plurality of plates each having a resist film formed thereon, baking she resist films on the plates under severally varying baking conditions, omitting to perform an exposing treatment on the resist films, and subjecting the resist films baked under their own baking conditions to a dissolving treatment to be severally performed under such prescribed conditions as induce partial dissolution of the resist films thereby determining as the condition for baking a prospective resist film the baking conditions of that of the resist films which has manifested an optimum trend of dissolution of resist film or a procedure which comprises preparing a plurality of plates each having a resist film formed thereon, baking the resist films on the plates severally under same prescribed baking conditions, omitting to perform an exposing treatment on the resist films, and subjecting the resist films to the same dissolving treatment as mentioned above thereby determining the developing conditions based on the baking conditions of that of the resist films which has manifested an optimum trend of dissolution of resist film. The expression "the case of manifesting the optimum trend of dissolution of resist film" as used herein means the case in which the degree of change in the thickness of resist film before and after the dissolution, namely, the amount of reducing resist thickness, is smallest or the case in which the uniformity of the thickness of the resist film in the plate after dissolution is highest.

It has been found that in the method mentioned above for determining the conditions for resist pattern formation, there are cases when the condition which maximizes the ratio of remaining resist thickness after the dissolving treatment and the condition which optimizes the uniformity of the remaining resist thickness will not necessarily coincide exactly, depending on the kind of resist, the range for the selection of the baking conditions, or the cooling condition.

Here, the quality of patterns is determined with particular emphasis on the quality of the shape of patterns (the rectangularity of patterns) and the uniformity of critical dimensions within a plate and between the plates. The optimum conditions for the formation of resist patterns are such that uniformity of critical dimensions within a plate and the stability thereof between the plates will be optimized and, at the same time, the conditions for obtaining the optimum pattern shape will be reconciled. It has been found that where the two conditions do not coincide, none of the conditions for the resist pattern formation is capable of reconciling the best pattern shape with the best uniformity of critical dimensions.

Now, the points raised above will be described in detail below.

Figure 1:
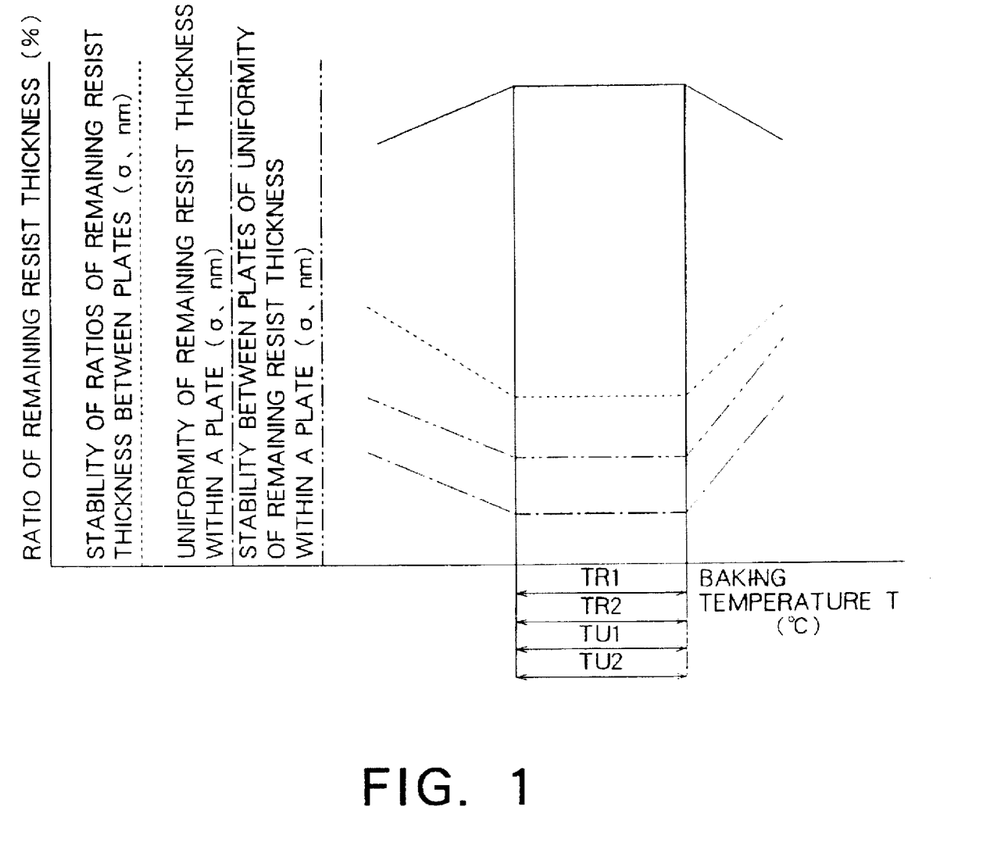
FIG. 1 is a diagram showing the relation between the resist baking temperature T and the trend of dissolution of resist films (the uniformity of ratios of remaining resist thickness and the stability thereof between the plates and the uniformity of remaining thickness within the plate and the stability thereof between the plates)
Figure 2:
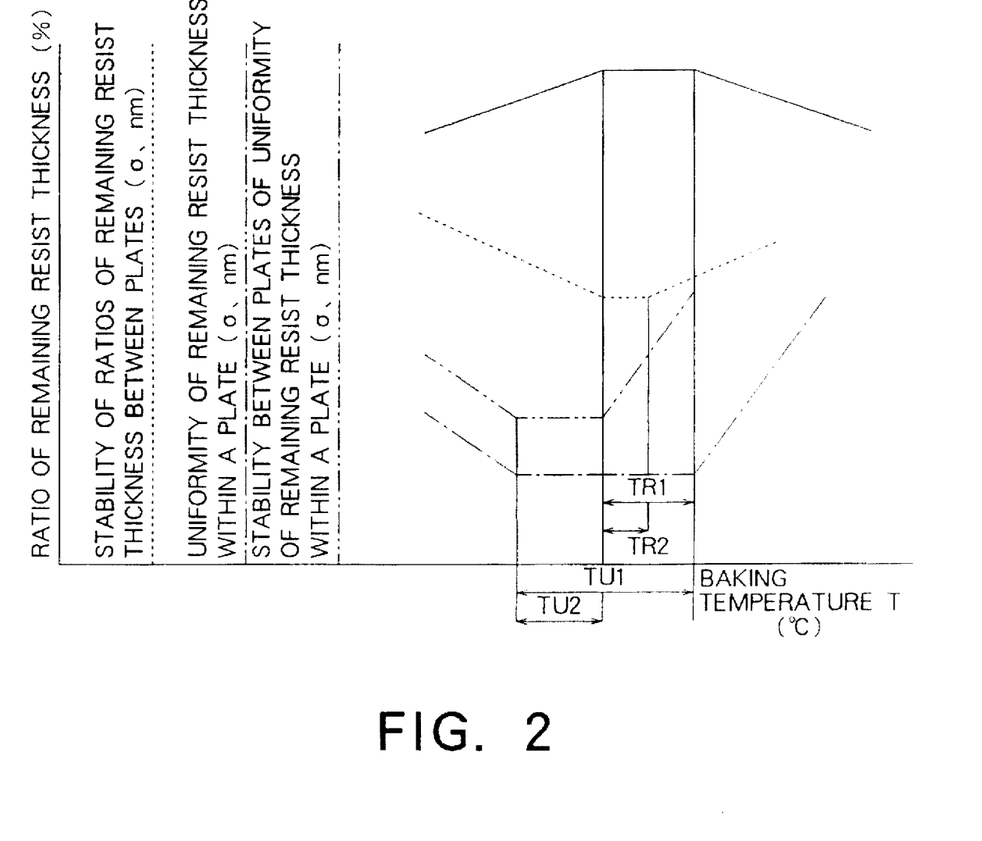
FIG. 2 is a diagram showing the relation between the resist baking temperature T and the trend of dissolution of resist films (the uniformity of ratios of remaining resist thickness and the stability thereof between the plates and the uniformity of remaining resist thickness within the plate and the stability thereof between the plates)

FIG. 1 and FIG. 2 are diagrams showing the relation between the resist baking temperature T and the trend of dissolution of resist film (the ratio of remaining resist thickness and the stability thereof between the plates, the uniformity of remaining resist thickness within a plate, and the stability thereof between the plates).

With reference to FIG. 1 and FIG. 2, the vertical axes represent the ratio of remaining resist thickness (unit=%, continuous line), the stability of the ratio of remaining resist thickness between the plates (3σ value; unit=nm, broken line), the uniformity of the remaining resist thickness within the plate (3σ value: unit=nm, alternate dash and dot line), and the stability between the plates of the uniformity of remaining resist thickness within the plate (3σ value; unit= nm, alternate two dots and one dash line) and the vertical axis represents the resist baking temperature T (unit=°C.).

Here, the ratio of remaining resist thickness refers to the ratio of the resist thicknesses before and after the partial dissolution of the resist film by a treatment with a chemical. The stability of the ratio of remaining resist thickness between the plates is expressed by the magnitude obtained by tripling the standard deviation, σ between the plates of the ratio of remaining resist thickness.

The uniformity of the remaining resist thickness within the plate is expressed by the magnitude obtained by tripling the standard deviation, σ of the dispersion of the remaining resist thickness after the dissolution at several points in the plate. The stability between the plates of the uniformity of remaining resist thicknesses on the plate is expressed by the magnitude obtained by tripling the standard deviation, σ between the plates of the uniformity of the remaining resist thickness mentioned above in the plate.

In the resist film cooling process responsible for the data of FIG. 1 and FIG. 2, the resist film was gradually cooled spontaneously until room temperature by allowing the plate with the resist film to stand at rest in an atmosphere of clean air.

The data of FIG. 1 and FIG. 2 were obtained of resists which were different in kind and which produced conspicuously different amounts of change in the critical dimension per unit variation of cooling temperature (1° C.).

With reference to FIG. 1 which depicts the data of the resist having a relatively small amount of change of the critical dimension per unit variation of baking temperature (1° C.), the range of baking temperature obtaining the highest ratio of remaining resist thickness (TR1), the range of baking temperature showing the test stability of the ratio of the remaining resist thickness between the plates (TR2), the range of baking temperature optimizing the uniformity of the remaining resist thickness within the plate (TU1), and the range of baking temperature showing the best stability of the remaining resist thickness between the plates (TU2) are found by comparison to coincide approximately even on the assumption that, at the resist film cooling process, the resist film was gradually cooled spontaneously until room temperature by allowing the plate with the resist film to stand at rest in an atmosphere of clean air. In this case, therefore, the baking conditions for maximizing the ratio of the remaining resist thickness after the dissolving treatment and the baking conditions for optimizing the uniformity of the remaining resist thickness within the plate coincide and reconcile.

With reference to FIG. 2 which depicts the data obtained of the resist which produced a relatively large amount of change in the critical dimension per unit variation of the baking temperature (1° C.), the range of baking temperature showing the highest ratio of remaining resist thickness (TR1) and the range of baking temperature for optimizing the stability of the ratio of the remaining resist thickness between the plates (TR2) occurred on a higher temperature side in the range of baking temperature for optimizing the uniformity of the remaining resist thickness within the plate (TU1) while the range of baking temperature for optimizing the stability between the plates of the uniformity of remaining resist thickness within the plate (TU2) occurred on a lower temperature side in the range TU1 mentioned above, indicating the absence of coincidence of TR1 and TR1 with TU2 even on the assumption that, at the resist film cooling process, the resist film was gradually cooled spontaneously until room temperature by allowing the plate with the resist film to stand at rest in an atmosphere of clean air.

In summary, under the conventional conditions for cooling the resist film, the range of baking temperature for maximizing the ratio of the remaining resist thickness (TR1) and the range of baking temperature for optimizing the ratio of the stability of the remaining resist thickness between the plates possibly fail to coincide with the range of baking temperature for optimizing the uniformity of the remaining resist thickness in the plate and the stability thereof between the plates (TU2).

According to the method formerly proposed by the present inventors for determining the conditions for pattern formation, the conditions for the formation of a resist film which reconcile the uniformity of the ratio of the remaining resist thickness within the plate or the uniformity of the remaining resist thickness within the plate with the uniformity between the plates of the ratio of the remaining resist thickness possibly fails to exist on the assumption that, at the resist film cooling process, the resist film is cooled gradually and spontaneously until room temperature by allowing the plate with the resist film to stand at rest in an atmosphere of clean air.

SUMMARY OF THE INVENTION

It is therefore an object of this invention to provide a method of determining conditions for a resist pattern formation process, which is capable of determining resist baking conditions in which stabilizing is carried out without relaying on such factors as the kind of resist about the uniformity of satisfactory critical dimensions within the plate and about the satisfactory ratio of the remaining resist thickness.

Other objects of this invention will become clear as the description proceeds.

According to an aspect of the present invention, there is provided a method of determining conditions for a resist pattern formation process having a baking operation which is carried out under a baking temperature and during a baking time. The method comprises the process of assuming a particular condition in which, after trial resist films are formed on a plurality of trial plates and then baked under baking conditions which are different from one another, the trial resist films are subjected to a dissolving treatment without an exposing treatment under predetermined treatment conditions in which each of the trial resist films is partially dissolved, determining, as the baking temperature, a temperature which minimizes a difference in a uniformity of remaining thickness of the trial resist fills in the trial plates relative to differences in baking times for the trial resist films in the particular condition, and determining, as the baking time, a time which makes the uniformity be best under the baking temperature in the particular condition.

According to another aspect of the present invention, there is provided a method of determining conditions for a resist pattern formation process having a baking operation which is carried out under a baking temperature and during a baking time. The method comprises the process of assuming a particular condition in which, after trial resist films are formed on a plurality of trial plates and then baked under baking conditions which are different from one another, the trial resist films are subjected to a dissolving treatment without an exposing treatment under predetermined treatment conditions in which each of the trial resist films is partially dissolved, determining, as the baking temperature, a temperature which minimizes a difference in an amount of reducing the trial resist thickness due to the dissolving treatment of the trial plates relative to differences in baking times for the trial resist films in the particular condition, and determining, as the baking time, a time which makes the amount of reducing thickness be smallest under the baking temperature in the particular condition.

According to still another aspect of the present invention, there is provided a method of determining a resist film cooling condition as a condition used on resist pattern formation. The method comprises the processes of preparing a plurality of trial plates on which trial resist films are formed, respectively, baking the plurality of the plates with the trial resist films under different baking conditions, and thereafter partially dissolving, without exposure, the trial resist films which are baked under the above-mentioned baking conditions, respectively. Under the circumstances, the method further comprises the processes of deciding a first baking temperature at which a variation in uniformity of remaining thicknesses of the trial resist films on the trial plates is minimized in relation to variations among baking times of the baking conditions, deciding a second baking temperature at which a variation of amounts of reducing thicknesses is minimized in relation to variations among the baking times when the trial resist films are dissolved, and determining, as the resist film cooling condition, a cooling condition such that a difference is minimized between the first and the second baking temperatures decided in the above-mentioned two deciding processes.

According to an aspect of the present invention, there is provided a method of forming a resist pattern. The method comprises the processes of assuming a particular condition in which, after trial resist films are formed on a plurality of trial plates and then baked under baking conditions which are different from one another, the trial resist films are subjected to a dissolving treatment without an exposing treatment under predetermined treatment conditions in which each of the trial resist films is partially dissolved, determining a baking temperature which minimizes a difference in a uniformity of the remaining thicknesses of the trial resist films in the trial plates relative to differences in baking times for the trial resist films in the particular condition, determining a baking time which makes the uniformity be best under the baking temperature in the particular condition, forming an actual resist film on an actual plate, baking the actual resist film under the baking temperature and during the baking time, cooling the actual resist film until room temperature after the baking process, exposing the actual resist film to a predetermined pattern after the cooling process, and performing a developing treatment on the actual resist film after the exposing process.

According to another aspect of the present invention, there is provided a method of forming a resist pattern. The method comprises the processes of assuming a particular condition in which, after trial resist films are formed on a plurality of trial plates and then baked under baking conditions which are different from one another, the trial resist films are subjected to a dissolving treatment without an exposing treatment under a predetermined treatment condition in which each of the trial resist films is partially dissolved, determining a baking temperature which minimizes a difference in reducing the trial resist thickness due to the dissolving treatment of the trial plates relative to differences in baking times for the trial resist films in the particular condition, determining a baking time which makes the reducing amount be smallest under the baking temperature in the particular condition, forming an actual resist film on an actual plate, baking the actual resist film under the baking temperature and during the baking time, cooling the actual resist film until room temperature after the baking process, exposing the actual resist film to a predetermined pattern after the cooling process, and performing a developing treatment on the actual resist film after the exposing process.

According to still another aspect of the present invention, there is provided a method of forming a resist pattern on the basis of a particular condition. The method comprises the processes of preparing a plurality of trial plates on which trial resist films are formed, respectively, baking the plurality of the plates with the trial resist films under different baking conditions, and thereafter partially dissolving, without exposure, the trial resist films which are baked under the above-mentioned baking conditions, respectively. Under the circumstances, the method further comprises the processes of deciding a first baking temperature at which a variation in uniformity of remaining thicknesses of the trial resist films on the trial plates is minimized in relation to variations among baking times of the baking conditions, deciding a second baking temperature at which a variation of amounts of reducing thicknesses is minimized in relation to variations among the baking times when the trial resist films are dissolved, determining, as the particular condition, a cooling condition such that a difference is minimized between the first and the second baking temperatures, forming and baking an actual resist film at the baking temperature during the baking time, cooling the actual resist film to the room temperature after the baking process, thereafter exposing the actual resist film to a predetermined pattern, and then developing the actual resist film.

DESCRIPTION OF PREFERRED EMBODIMENTS

The first invention, based on the fact that when resist films baked under severally varying baking conditions are subjected to a dissolving treatment under usually unaccepted intense conditions productive of large amount of reducing thickness, the sensitivity of discernment of the influences caused by the baking conditions is exalted and, at the same time, the uniformity of remaining resist thickness within the plate and the stability thereof between the plates are optimized under such resist film baking conditions that the conditions of baking temperatures will minimize the changes in the uniformity of the remaining resist thickness after the dissolving treatment relative to the changes in the baking times of the resist films and the baking times will optimize the uniformity of remaining resist film thickness within the plate under the conditions of baking temperatures, determines the baking temperatures and times as the conditions for baking a prospective resist film.

The second invention, based on the fact that when resist films baked under severally varying baking conditions are subjected to a dissolving treatment under usually unaccepted intense conditions productive of large amount of reducing thickness, the discerning sensitivity for the influences caused by the baking conditions is exalted and, at the same time, the stability of remaining resist thickness and the stability thereof between the plates are optimized under such resist film baking conditions that the conditions of baking temperature will minimize the changes in the amount of reducing thickness due to the dissolving treatment relative to the changes in the baking times of the resist films and the baking times will minimize the amount of reducing thickness under the conditions of baking temperatures, determines the baking temperature and times as the conditions for baking a prospective resist film.

The third invention, based on the fact that when resist films baked under severally varying baking conditions are subjected to a dissolving treatment under usually unaccepted intense conditions productive of large amount of reducing thickness, the discerning sensitivity for the influences caused by the baking conditions is exalted and, at the same time, the uniformity of remaining resist thickness within the plate and the stability thereof between the plates and the stability of the ratio of the remaining resist thickness and the stability thereof between the plates are reconciled under such cooling conditions that the difference between the baking temperature minimizing the changes of uniformity of remaining resist thickness relative to the changes in resist film baking time and the baking temperature for minimizing the changes in the amount of reducing thickness (the amount of remaining resists or the ratios of remaining resists) due to the dissolving treatment will be minimized, determines the cooling conditions as the conditions for cooling a prospective resist film.

Now, this invention will be described in detail below.

This invention is based on the fact that when baked resist films, without undergoing an exposing treatment, are subjected to a dissolving treatment under conditions for inducing partial dissolution of the resist films, the trend of dissolution of the resist films (hereinafter referred to simply as "trend of dissolution") depends on the baking conditions used for the resist films and, besides, the trend of dissolution and the quality of the resist patterns actually formed through the subsequent processes of exposure and development (hereinafter referred to simply as "quality of pattern") have a fixed correlation.

Figure 3:
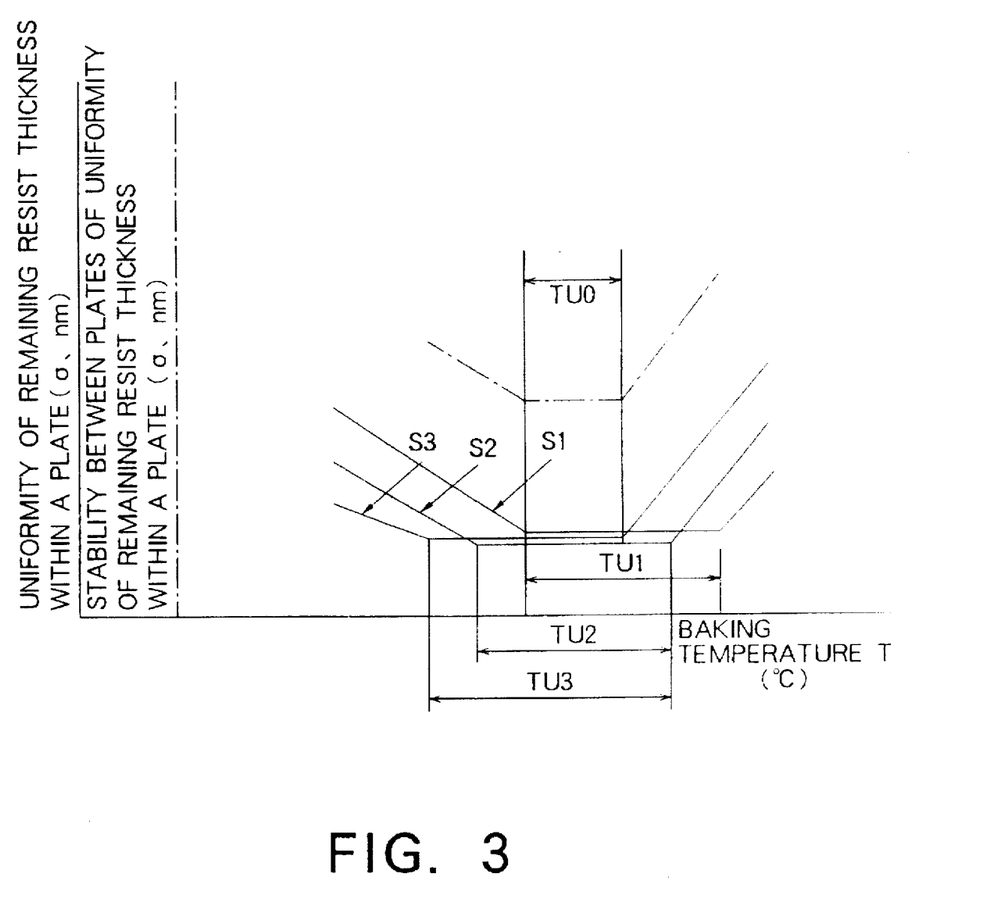
FIG. 3 is a diagram showing the relation between the resist baking conditions and the uniformity of remaining resist thickness within the plate and the stability between the plates of the uniformity of remaining resist thickness within the plate after the dissolution treatment.
Figure 4:
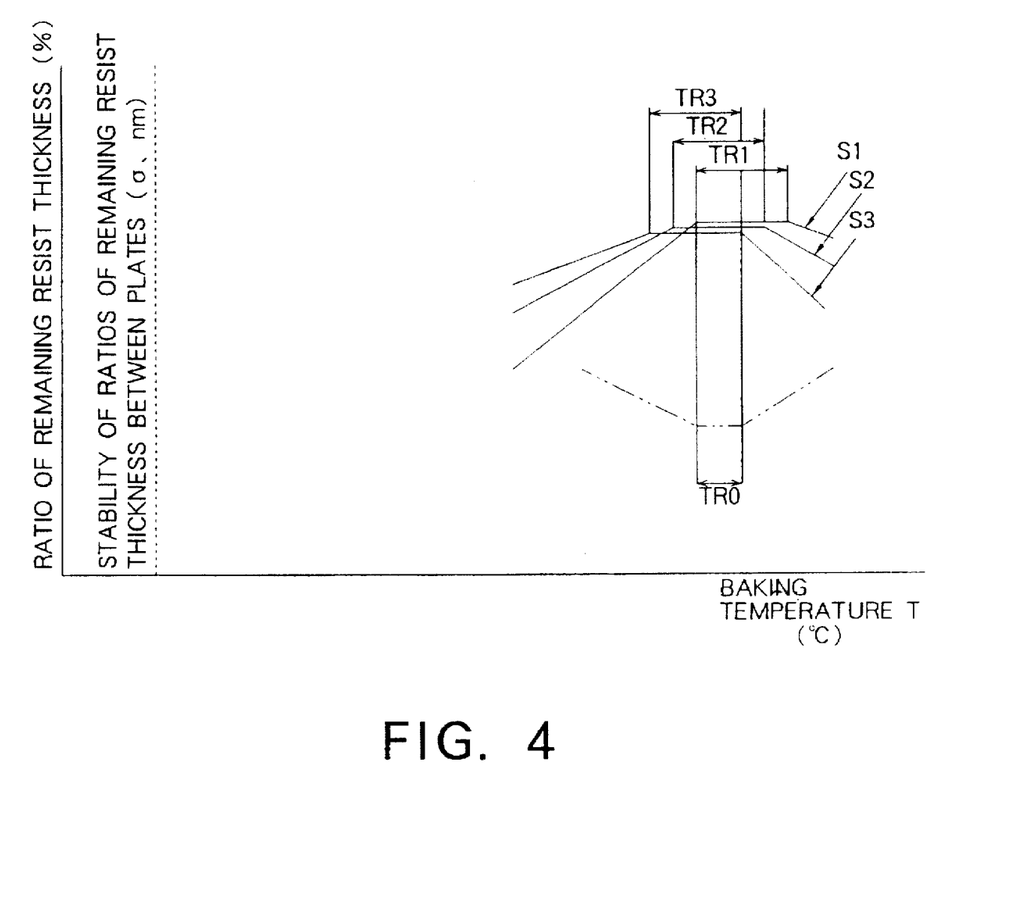
FIG. 4 is a diagram showing the relation between the resist baking conditions, the relation between the resist films due to the dissolution treatment (ratios of remaining resist thickness after the dissolution treatment), and the stability of the amount of reducing thickness (ratios of remaining resist thickness) between the plates.

FIG. 3 and FIG. 4 are diagrams that depict this fact.

FIG. 3 is a diagram showing the relation between the resist baking conditions and the uniformity of remaining resist thickness within the plate and the stability between the plates of the uniformity of remaining resist thickness within the plate.

In FIG. 3, the vertical axes represent the magnitudes of the uniformity of remaining resist thickness (3σ value; unit=nm, solid lines) within the plate obtained at the baking temperatures S1, S2, and S3 (S1<S2<S3, unit=nm) and the stability between the plates of the uniformity of remaining resist thickness within the plate (3σ value; unit=nm, alternate one dash one dot line) and the horizontal axis represents the resist baking temperature (unit=°C.). The term "baking temperature" as used herein refers to the temperature of the heat source of the baking device or the temperature of the plate surface undergoing the baking treatment and the term "baking time" refers to the duration in which the baking device performs forced heating of the plate under treatment.

It is noted from FIG. 3 that in the resist films baked for varying times and then subjected to a dissolving treatment, the uniformity of remaining resist thickness within the plate and the stability thereof between the plates were optimized under such film baking conditions that the range of baking temperature minimized the changes in uniformity of resist film thickness (remaining resist thickness) within the plate and the baking time optimized the uniformity of remaining resist thickness within the plate in the range of baking temperature mentioned above.

In FIG. 3, the range of baking temperature which optimized the uniformity of remaining resist thickness within the plate was TU1 for the baking time S1. By the same token, the range of baking temperature which optimized the uniformity of remaining resist thickness within the plate was TU2 for the baking time S2 and the range of baking temperature which optimized the uniformity of remaining resist thickness within the plate was TU3 for the baking time S3. In the higher range of temperature than the range of baking temperature TU0, the uniformity of remaining resist thickness within the plate gradually degraded when the baking time was elongated to S1, S2, and S3. In the lower range of temperature than the range of baking temperature TU0, the uniformity of remaining resist thickness within the plate gradually degraded when the baking time was shortened to S3, S2, and S1.

The range of baking temperature which minimized the changes (maximized the stability) of the uniformity of remaining resist thickness within the plate relative to the changes of baking time was TU0. In the range of baking temperature TU0, it was in the baking time S2 that the uniformity of remaining resist thickness within the plate was optimized.

After all, FIG. 3 shows that the baking conditions that optimized the uniformity of remaining resist thickness within the plate and the stability between the plates of the uniformity of remaining resist thickness within the plate after the dissolving treatment were the range of baking temperature TU0 and the baking time S2. The patterns to be produced under these baking conditions enjoy the uniformity of critical dimensions.

FIG. 4 is a diagram showing the relation between the baking conditions for resists and the changes in the amount of reducing thickness by the dissolving treatment (the ratios of remaining resists after the dissolving treatment) and the stability of the amount of reducing thickness (the ratios of remaining resists) between the plates.

In FIG. 4, the vertical axes represent the ratios of remaining resist thickness (unit=%, solid lines) after the dissolving treatment obtained at the baking temperatures S1, S2, and S3 (S1<S2<S3, unit=nm) and the stability of remaining resist thickness between the plates (3σ value; unit=%, alternate one dash two dots line) and the vertical axis represents the resist baking temperature T (unit=°C.). The term "baking temperature" as used herein refers to the temperature of the heat source of the baking device or the temperature of the plate surface undergoing the baking treatment and the term "baking time" refers to the duration in which the baking device performs forced heating of the plate under treatment.

It is noted from FIG. 4 that in the resist films baked for varying times and then subjected to a dissolving treatment, the stability of the ratios of remaining resists and the stability thereof between the plates were optimized under such resist film baking conditions that the range of baking temperature minimized the changes of the ratios of remaining resist thickness and the baking time optimized the ratios of remaining resists in the range of baking temperature mentioned above.

In FIG. 4, the range of baking temperature which optimized the ratios of remaining resists was TR1 for the baking time S1. By the same token, the range of baking temperature which optimized the ratios of remaining resists was TR2 for the baking time S2 and the range of baking temperature which optimized the ratios of remaining resists was TR3 for the baking time S3. In the higher range of temperature than the range of baking temperature TR0, the ratios of remaining resists gradually degraded when the baking time was elongated to S1, S2, and S3. In the lower range of temperature than the range of baking temperature TU0, the ratios of remaining resists gradually degraded when the baking time was shortened to S3, S2, and S1.

The range of baking temperature which minimized the changes (maximized the stability) of the changes of the ratios of remaining resists relative to the changes of baking time was TR0. In the range of baking temperature TR0, it was in the baking time S1 that the ratios of remaining resists was optimized.

After all, FIG. 4 shows that the baking conditions that optimized the ratios of remaining resist thickness and the stability of ratios of remaining resists between the plates were the range of baking temperature TR0 and the baking time S1. The patterns to be produced under these baking conditions enjoy the beet uniformity of critical dimensions.

Figure 5:
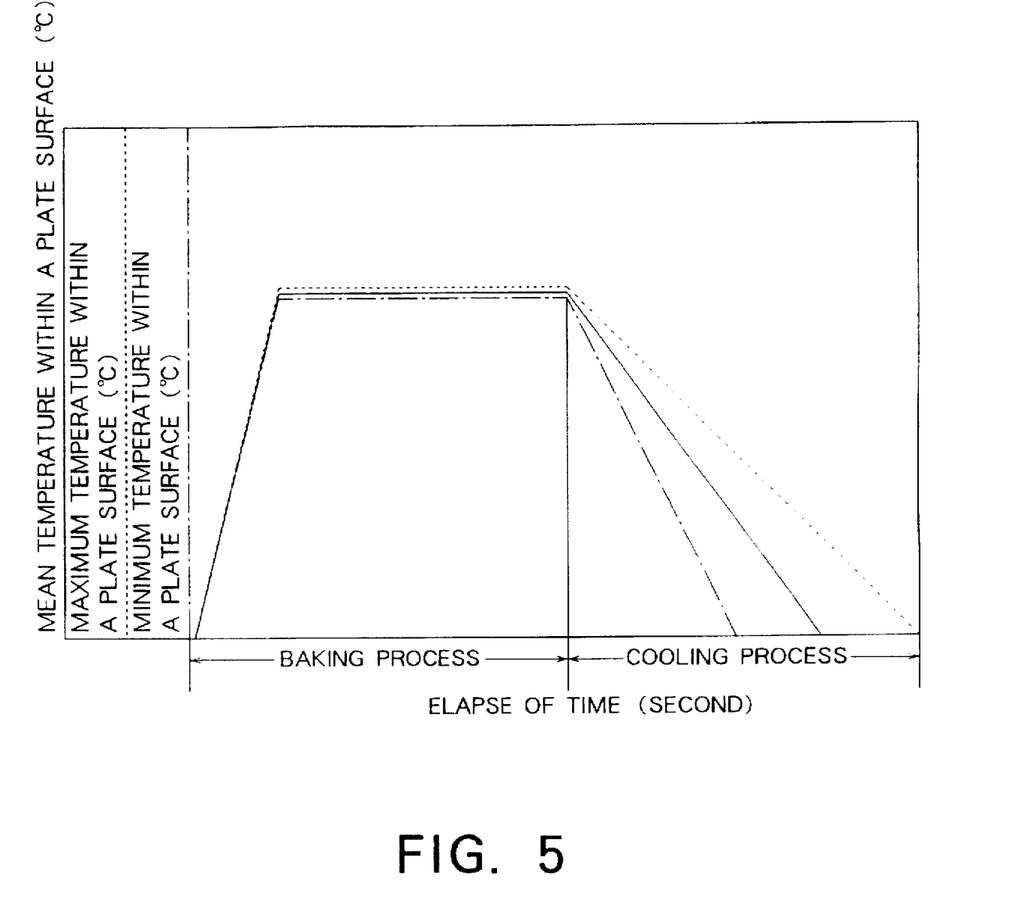
FIG. 5 is a diagram showing the relation between the elapse of time through the baking process and the cooling process, the temperatures of the plate surface (mean temperatures), and the dispersion thereof within the plate.

FIG. 5 is a diagram showing the relation between the lengths of time elapsing through the resist baking process and cooling process and the temperatures (mean temperatures) of the plate surface and the dispersion thereof within the plate. In FIG. 5, the vertical axes represent the temperatures of the plate surface under baking treatments (mean temperatures; unit=°C., solid line), the highest of the temperatures of the plate surface (unit=°C., broken line), and the lowest of the temperatures of the plate surface (unit=°C., alternate one dash one dot line) and the vertical axis represents the lengths of time elapsing from the start of the resist baking process to the end of the cooling process (unit= seconds).

It is noted from FIG. 5 that the dispersion of temperatures of the plate surface was relatively small within the baking time, namely within the time between the start of rise of the temperatures of the plate surface and the start of fall of the temperatures after completion of the baking process, the dispersion of temperatures of the plate surface was large during the cooling process, namely, within the time between the start of fall of the temperatures of the plate surface after completion of the baking process and the arrival of the temperatures at room temperature, and the time required for the temperatures of the plate surface to reach the room temperature was dispersed within the plate. Generally, the cooling process which effects gradual cooling of the plates to room temperature by causing the plates to stand at rest in an atmosphere of clean air suffers large dispersion of the temperatures of the plate surface as compared with the baking process which resorts to forced application of heat. When the plates grow in size and in thickness and consequently incur an addition to their specific heat capacity, the time required for cooling the plates is proportionately elongated and the dispersion of the temperatures of the plate surface during the cooling process tends to expand further.

The dispersion of the temperatures of the plate surface mentioned above and the dispersion of the time required for the temperatures of the plate surface to reach room temperature are not confined within the plate but suffered to manifest an influence evidently between the plates.

Further during the cooling process, namely within the time between the start of fall of the temperatures of the plate surface and the arrival thereof at room temperature, the plates receive the same influence as when the baking time is extended owing to the excess heat originating in the specific heat capacity.

With reference to FIG. 3 and FIG. 4, the baking time is extended from S1 to S2 and to S3, for example, and the resist films reach the same state as when they are baked to an excess and, as a result, the uniformity of critical dimension within the plate or the stability thereof between the plates is impaired.

It is explained in the light of the relation of FIG. 3 and FIG. 4 with FIG. 5 that the quality of patterns (uniformity of critical dimension or shapes of patterns) and the stability thereof between the plates are optimized under such baking conditions that the trend of dissolution will be most stabilized relative to the resist baking conditions (baking temperature and baking time).

Further, eliminating the excess heat originating in the specific heat capacity of the plates during the cooling process, namely within the time between the start of fall of the temperatures of the plate surface and the arrival thereof at room temperature, the same influence as would be produced when the baking time was extended can be eliminated and the baking conditions that optimize the uniformity of the quality of patterns within the plates and the uniformity of critical dimensions within the plate and the stability thereof between the plates (while reconciling the uniformity of critical dimensions and the shapes of patterns) can be obtained.

It is further explained that the baking condition and the cooling condition that are most appropriate for optimizing the quality of patterns (optimizing and reconciling the uniformity of critical dimensions and the shapes of patterns can be determined with high accuracy by simply examining the resist films for trend of dissolution without actually patterning the resist and measuring the produced resist patterns to test for the accuracy of critical dimensions or visually observing the shapes of the produced patterns.

In the method formerly proposed, the baking conditions are determined in accordance with a plurality of indexes (ratios of remaining resist thickness and uniformity of remaining resist thickness within the plate) and the choice of pattern accuracy to be exercised as occasion demands (specifically the choice between the uniformity of critical dimensions and the shapes of patterns) at times prevents the optimum baking conditions from coinciding with these indexes. According to the method of this invention for determining the cooling conditions among other methods further contemplated by this invention, the optimum baking conditions that reconcile the ratios of remaining resist thickness, the uniformity of remaining resist thickness within the plate, and the stability thereof between the plates can be determined infallibly with high accuracy as compared with the formerly proposed method by determining the cooling conditions without requiring to select the indexes for the resist baking conditions (baking temperature and baking time) in conformity with the accuracy to be chosen as occasion demands. In this invention, since the work of development is not carried out for the purpose of actually forming resist patterns, the conditions for dissolution of resist films can be arbitrarily selected during the determination of the baking conditions.

In this invention, it is appropriate to adopt, as the conditions for a dissolving treatment intended to induce partial dissolution of resist films, such conditions for a dissolving treatment as produce large amount of reducing thickness (conditions for a strong dissolving treatment) corresponding to smaller amount of remaining resist thickness or ratios of remaining resist thickness than the amount of remaining resist thickness or ratios of remaining thickness normally accepted as proper for the developing conditions in the actual formation of a resist pattern (the unexposed area of a resist film normally is not desired to reduce).

This is because the use of such conditions for a dissolving treatment as produce large amount of reducing thickness enables the difference in trend of dissolution which depends on the difference in the baking conditions to be enlarged to the extent of exalting the sensitivity of discernment. AS a result, the outcomes of the dissolving treatment can be examined in detail (for the determination of relevant conditions).

The conditions for a dissolving treatment which produce large amount of reducing thickness (conditions for a strong dissolving treatment) can be attained, for example, by increasing the concentration of a developing liquid, varying the kind and formulation of chemicals used for the treatment, or elongating the time for the dissolving treatment.

The method for determining the baking conditions and the method for determining the cooling conditions according to this invention are effectively applicable without reference to the kind of substance used for the resist.

For example, the method for determining the baking conditions and the method for determining the cooling conditions of this invention can be applied equally effectively for positive resists (novolak based type, high-molecular polymer type, chemical amplified type, etc.), positive-negative amphiprotic resists, and negative resists.

Incidentally, in the case of negative resist, it is proper to use, as the conditions for a dissolving treatment intended to induce partial dissolution of a resist film, such conditions for a dissolving treatment as produce amply small amount of reducing thickness (conditions for a weak dissolving treatment) (generally in the negative resists, the unexposed area of resist film is instantaneously dissolved completely under the conditions of development treatment used for the formation of a pattern).

The method for the formation of a resist pattern according to this invention implements the formation of a resist pattern by subjecting resist films to the processes of baking, cooling, exposure, and development using the baking conditions and the cooling conditions which have been determined by the method for determining the conditions for the formation of a resist pattern described above.

The method of this invention for the formation of a resist pattern can form a resist pattern of high quality (and consequently an ultimately finished pattern of high accuracy) while reconciling the high quality of pattern shape and the high uniformity of critical dimensions without requiring the work of baking to be performed under the conditions for optimum baking which are determined in conformity with the accuracy to be chosen as occasion demands (the choice between the uniformity of critical dimensions and the shapes of patterns) by indispensable use of indexes regarding the conditions for baking resists (baking temperature and baking time).

Now, this invention will be described more specifically below with reference to working examples.

EXAMPLE 1

Some conditions were determined by the method for determination of the conditions for the formation of a resist pattern which basically comprises the following processes and these conditions were used to form resist patterns through the processes of patterning, exposure, and development.

Process 1: A process for applying a resist by spinning coating on plates.

Process 2: A process for baking the formed resist films.

Process 3: A process for cooling the baked resist films.

Process 4: A process for subjecting the resist films to a dissolving treatment under such conditions as dissolve the unexposed areas of the resist films to a certain extent (partially).

Process 5: A process for examining the resist films resulting from the dissolving treatment performed at Process 4 to determine the ratios of remaining resist thickness and the uniformity of remaining resist thickness within the plate.

At Process 1, the resist is to be applied to as many plates as the number of baking conditions required to be tested. At Process 2, the formed resist films are to be baked under severally varied baking conditions. At Process 3, the baked resist films are to be cooled under one same cooling condition. At Process 4, the resist films are to be subjected to a dissolving treatment under one same condition for dissolving treatment.

The method for formation of resist patterns according to one embodiment of this invention effects the formation of resist patterns by determining the conditions in accordance with the aforementioned method for determining the conditions for the formation of resist patterns and subjecting the resist films to the processes of patterning, exposure, and development under the conditions so determined.

Now, concerning the positive resists of the type which require the exposed area thereof to be removed by development, a case of actually determining the conditions for baking and implementing the formation of resist patterns under the conditions will be cited below.

Example of determining conditions for baking

First, several plates (blank) each produced by depositing a chromium film on a square quartz plate of suitably polished surface, 0.25 inch in thickness and 6 inches×6 inches in surface area, were prepared. They were mounted one by one on a spinning stage. An i-line resist (NRP-895i: produced by Nagase Sangyo K.K.) solution was dropped through a nozzle onto the plates on the spinning stage, resist films were formed by spinning coating on the plates. The applied resist films on the plates were baked and cooled to produce resist films about 5000 Å in thickness.

Under a total of 30 conditions (each for two plates) formed by combining five baking temperatures separated at intervals of 10° C. between 100° C. and 140° C. each with six baking times separated at intervals of 70 seconds between 360 seconds and 710 seconds, these plates were subjected to baking treatments on a hot plate. The baked plates were then left standing at rest in an atmosphere of clean air to be cooled spontaneously to room temperature.

Subsequently, the resist films on the 30 sets of the plates (total of 60 plates) produced one each by the 30 varying baking conditions mentioned above were tested for thickness [at 441 points (21 points each in 21 rows) in an area of the square of 5.0 inches at the center of each plate] with a spectral interference type film thickness analyzer (produced by Canon Inc. and marketed under product code of "TM-005") using the method for optically measuring a film thickness from the spectral reflectance curve to find by calculation the average of resist film thickness at the points of measurement and the magnitude of standard deviation $\sigma$ thereof.

Then the other 30 plates which had undergone the 30 varying baking conditions mentioned above were subjected to a dissolving treatment by the 60 seconds spinning and spraying method using a solution obtained by diluting the master solution (produced by Hoechst Industry Co., Ltd. and marketed under product code of "AZ-400K") of a developing liquid with water at a water: master solution ratio of 25:75. Subsequently, they were rinsed with pure water for 30 seconds, dried by spinning, and left standing at rest.

Subsequently, the resist films thoroughly dried after the dissolution treatment were tested for thickness [at 441 points (21 points each in 21 rows) in an area of the square of 5.0 inches at the center of each plate] with a spectral interference type film thickness analyzer (produced by Canon Inc. and marketed under product code of "TM-005") using the method for optically measuring a film thickness from the spectral reflectance curve to find by calculation the average of resist film thicknesses at the points of measurement and the magnitude of standard deviation $\sigma$ thereof.

Tables 1 and 2 show the results of the measurement of film thickness on the plates after the dissolution treatment.

TABLE 1

| Firing Temperature | Uniformity of Remaining Resist Thickness within a Plate (Å, $\sigma$ value) | | | | | | Standard Deviation |
|---|---|---|---|---|---|---|---|
| | Firing Time (sec) | | | | | | |
| (°C.) | 360 | 430 | 500 | 570 | 640 | 710 | ($\sigma$) |
| 100 | 41 | 42 | 38 | 32 | 35 | 29 | 5.12 |
| 110 | 36 | 34 | 28 | 23 | 24 | 24 | 5.56 |
| 120 | 29 | 27 | 20 | 19 | 23 | 22 | 3.81 |
| 130 | 23 | 24 | 34 | 31 | 39 | 44 | 8.08 |
| 140 | 34 | 61 | 60 | 109 | 118 | 139 | 40.9 |

TABLE 2

| Firing Temperature | Ratio of Remaining Resist Thickness (%) | | | | | | Standard Deviation |
|---|---|---|---|---|---|---|---|
| | Firing Time (sec) | | | | | | |
| (°C.) | 360 | 430 | 500 | 570 | 640 | 710 | ($\sigma$) |
| 100 | 62 | 66 | 69 | 70 | 71 | 72 | 3.72 |
| 110 | 74 | 78 | 80 | 81 | 82 | 82 | 3.08 |
| 120 | 82 | 84 | 85 | 86 | 85 | 86 | 1.51 |
| 130 | 89 | 89 | 88 | 88 | 88 | 88 | 0.52 |
| 140 | 89 | 88 | 88 | 85 | 83 | 80 | 3.51 |

In Table 1, the magnitudes of uniformity of remaining resist thickness within a plate corresponding to the varying baking temperatures and baking periods are shown in terms of the standard deviation $\sigma$ and the dispersions of the magnitude of the standard deviation σ corresponding to the varying baking temperatures and baking times are shown in terms of the standard deviation σ.

In Table 2, the ratios of remaining resist thickness (the ratios of the amount of remaining resist films to the applied film thickness before and after the dissolution) corresponding to the varying baking temperatures and baking times and, at the same time, the dispersions of the magnitudes of these ratios of remaining resist thickness relative to the varying baking temperatures and baking times are shown in terms of the standard deviations σ.

It is noted from Table 1 that the changes of uniformity (the standard deviation σ of remaining resist thickness within the plate relative to the changes of baking times were smallest at the baking temperature of 120° C. and the best uniformity of remaining resist thickness within the plate was obtained in the samples baked at 120° C. for a period of 570 seconds.

It is also noted from Table 1 that relatively satisfactory uniformity of remaining resist thickness within the plate (the standard deviation σ less than 30 nm, for example) was obtained under 13 conditions.

On the basis of the results of test mentioned above, the optimum baking conditions for the resist used in the present example to acquire (seek) the uniformity of remaining resist thickness within the plate and the stability thereof between the plates, namely, to secure the uniformity of critical dimensions were determined to be the baking temperature of 120° C. and the baking time of 570 seconds (the baking conditions for "Method 1" indicated in the diagram).

It is further noted from Table 2 that the changes (standard deviation σ of the ratios of remaining resist thickness relative to the changes of baking time were smallest at the baking temperature 130° C. and the most satisfactory ratios of remaining resist thickness were obtained in the samples baked at 130° C. for times from 360 seconds to 430 seconds.

On the basis of the results of test mentioned above, the optimum baking conditions for the resist used in the present example to acquire (seek) the stability of the ratios of remaining resist thickness and the stability thereof between the plates were determined to be the baking temperature of 130° C. and the baking times of 360 seconds–430 seconds (the baking conditions for "Method 2" indicated in the diagram).

Example of determining conditions for cooling

In the same manner as in the example of determining the conditions for baking described above, the plates were subjected to baking treatments on a hot plate under a total of 30 conditions (each for two plates) formed by combining five baking temperatures separated at intervals of 10° C. between 100° C. and 140° C. each with six baking times separated at intervals of 70 seconds between 360 seconds and 710 seconds. At the process of cooling the resist films subsequent to the baking treatments, the plates were left standing at rest for 360 seconds on a cooling plate kept at room temperature by having circulated therethrough the constant temperature water kept at room temperature and supplied from a constant temperature water supply device until the resist films carried on the plates reached room temperature instead of causing the plates to be cooled gradually by standing at rest in an atmosphere of air.

Subsequently, the resist films on the 30 sets of the plates (total of 60 plates) produced one each by the 30 varying baking conditions mentioned above were tested for thickness [at 441 points (21 points each in 21 rows) in an area of the square of 5.0 inches at the center of each plate] with a spectral interference type film thickness analyzer (produced by Canon Inc. and marketed under product code of "TM-005") using the method for optically measuring a film thickness from the spectral reflectance curve to find by calculation the average of resist film thicknesses at the points of measurement and the magnitude of standard deviation σ thereof.

Then, the other 30 plates which had undergone the 30 varying baking conditions mentioned above were subjected to a dissolving treatment by the 60 seconds spinning and spraying method using a solution obtained by diluting the master solution (produced by Hoechst Industry Co., Ltd. and marketed under product code of "AZ-400K") of a developing liquid with water at a water: master solution ratio of 25:75. Subsequently, they were rinsed with pure water for 30 seconds, dried by spinning, and left standing at rest.

Subsequently, the resist films thoroughly dried after the dissolution treatment were tested for thickness [at 441 points (21 points each in 21 rows) in an area of the square of 5.0 inches at the center of each plate] with a spectral interference type film thickness analyzer (produced by Canon Inc. and marketed under product code of "TM-005") using the method for optically measuring a film thickness from the spectral reflectance curve to find by calculation the average of resist film thickness at the points of measurement and the magnitude of standard deviation σ thereof.

Tables 3 and 4 show the results of the measurement of film thickness on the plates after the dissolution treatment.

TABLE 3

| Firing Temperature | Uniformity of Remaining Resist Thickness within a Plate (Å, σ value) | | | | | | Standard Deviation |
|---|---|---|---|---|---|---|---|
| | Firing Time (sec) | | | | | | |
| (°C.) | 360 | 430 | 500 | 570 | 640 | 710 | (σ) |
| 100 | 43 | 48 | 37 | 34 | 35 | 28 | 7.15 |
| 110 | 36 | 29 | 25 | 25 | 26 | 26 | 4.25 |
| 120 | 27 | 25 | 23 | 21 | 22 | 28 | 2.71 |
| 130 | 23 | 25 | 26 | 25 | 28 | 41 | 6.45 |
| 140 | 23 | 34 | 60 | 71 | 99 | 128 | 39.6 |

TABLE 4

| Firing Temperature | Ratios of Remaining Resist Thickness (%) | | | | | | Standard Deviation |
|---|---|---|---|---|---|---|---|
| | Firing Time (sec) | | | | | | |
| (°C.) | 360 | 430 | 500 | 570 | 640 | 710 | (σ) |
| 100 | 64 | 74 | 73 | 74 | 74 | 75 | 4.13 |
| 110 | 74 | 79 | 80 | 81 | 81 | 81 | 2.73 |
| 120 | 83 | 84 | 84 | 85 | 85 | 85 | 0.82 |
| 130 | 89 | 89 | 89 | 89 | 88 | 88 | 0.52 |
| 140 | 91 | 89 | 87 | 84 | 78 | 73 | 6.92 |

In Table 3, the magnitudes of uniformity of remaining resist thickness within the plate corresponding to the varying baking temperatures and baking times are shown in terms of the standard deviation σ and the dispersions of the magnitudes of the standard deviation σ corresponding to the varying baking temperatures and baking times are shown in terms of the standard deviation σ.

In Table 4, the ratios of remaining resist thickness (the ratios of the amount of remaining resist thickness to the applied film thickness before and after the dissolution)

corresponding to the varying baking temperatures and baking times and, at the same time, the dispersions of the magnitudes of these ratios of remaining resists relative to the varying baking temperatures and baking times are shown in terms of the standard deviations σ.

It is also noted from Table 3 that the baking conditions that produced relatively satisfactory uniformity of remaining resist thicknesses within the plate (the standard deviation σ less than 30 nm, for example) were obtained in 18 conditions for rapid cooling and evidently increased on the higher temperature side of the baking conditions as compared with the 13 conditions for gradual cooling by standing at rest in an atmosphere of air (Table 1). It is further noted from Tables 2 and 4 that the baking temperatures at which the changes of the amount of reducing thickness due to the dissolving treatment were smallest were hardly changed.

As a result, the baking temperature (zone) at which the changes in uniformity of remaining resist thickness within the plate relative to the changes in baking time were small and the baking temperature at which the changes in the amount of reducing resist thickness (amount of remaining resists or ratios of remaining resists) due to the dissolving treatment showed the smallest difference (by comparison of Tables 1 and 2 with Tables 3 and 4).

On the basis of the results of test described above, the operation of keeping the plates at rest for 360 seconds on a cooling plate kept at room temperature by having circulated therethrough the constant temperature water kept at room temperature and supplied from a constant temperature water supply device until the resist films carried on the plates were rapidly cooled to room temperature was determined as the cooling condition for the process of cooling the resist films subsequent to the baking treatments, concerning the resist used in the example which produced the data of Tables 2 and 4.

Example of formation of resist pattern

In the same manner as in the example of determining the conditions of baking and the example of determining the conditions of cooling described above, two kinds each of three plates, one kind baked at 120° C. for 570 seconds and the other baked at 130° C. for 430 seconds and then cooled, were exposed to a given figure of radiation by the use of an argon laser reticle writer (exposure wavelength of 363.8 nm). Subsequently, they were subjected for 60 seconds to a developing treatment using an aqueous 1.67% TMAH (tetramethylammonium hydroxide) solution as a developing liquid to form a resist pattern thereon.

The results are shown in Table 5 for the uniformity of critical dimensions within the plate and the stability thereof between the plates and the degrees of inclination of the lateral walls of patterns relative to the plates.

TABLE 5

| Method for determination of conditions | Baking condition Temperature (°C.) | Baking condition Time (sec) | Cooling condition | Number of sample (pcs) | Quality of pattern Mean (nm) | Quality of pattern Standard deviation (σ, nm) | Angles of Inclination of pattern (degree) |
| --- | --- | --- | --- | --- | --- | --- | --- |
| Method 1 | 120 | 570 | Novel conditions | 3 | 54 | 8.54 | 67 |
| Method 2 | 130 | 430 | Novel conditions | 3 | 72 | 13.00 | 74 |
| Conventional method | 130 | 430 | Conventional conditions | 3 | 84 | 21.00 | 74 |

Table 5 shows the mean values ["average (nm)" in the diagram] produced by tripling the standard deviations σ of a prescribed pattern size in the plates and the values of the standard deviation a of the averages corresponding to the baking conditions (each used on 3 plates) ["standard deviation (σ nm" in the diagram], which were obtained by forming resist patterns of a prescribed design size one each on the plates manufactured under the varying baking conditions and measuring the resist patterns [at 25 points (5 points each in five rows) in an area of the square of 130 mm at the center of plate). It further shows the degrees of inclination of the lateral walls of a pattern relative to the plate, obtained of the resist patterns of a prescribed design size formed on the plates manufactured under the varying baking conditions.

The results indicate that the resist patterns formed on the plates resulting from a baking treatment performed at 130° C. for 430 seconds assumed a shape approximating closely to an evidently ideal rectangular shape (the degrees of inclination of the lateral walls of the patterns relative to the plates were close to perpendicularity and the contrasts were proportionately high) as compared with those formed on the plates resulting from a baking treatment performed at 120° C. for 570 seconds.

As respects the uniformity of critical dimensions within the plate and the stability thereof between the plates, the results obtained of the plates resulting from a baking treatment performed at 120° C. for 570 seconds were evidently superior to those of the plates resulting from a baking treatment performed at 130° C. for 430 seconds.

The conventional method used the same baking conditions as the baking conditions 2 determined by the method of this invention and obtained resist patterns in a shape approximating closely to an ideal rectangular shape. As respects the uniformity of critical dimensions within the plate and the stability thereof between the plates, however, the results of the conventional method owing to the cooling conditions were evidently inferior to the results of the baking and cooling conditions determined by the method of this invention.

Specifically, the method for determining the conditions for the formation of resist patterns according to this invention can determine the optimum baking conditions infallibly with high accuracy because it selects the indexes for the conditions of baking resists (baking temperature and baking times) in conformity with the quality of patterns to be sought as occasion demands (namely the choice between the shapes of patterns and the accuracy of critical dimensions). It can also form resist patterns of high accuracy while reconciling high quality of the shapes of patterns and high uniformity of the critical dimensions by simultaneously determining the optimum cooling conditions.

EXAMPLES 2–8

When baking conditions were actually determined and resist patterns were formed by repeating the procedure of Example 1 while using varying resists, THMR-iP1700 (product of Tokyo Ouka Kogyo K.K.), THMR-iP3500 (product of Tokyo Ouka Kogyo K.K.), AZ-5200 (product of Hoechst Industry Co., Ltd.), EBR-900M-1 (product of Toray Industries, Inc.), ZMP-300 (product of the Nippn Geon K.K.), ZMP-7000 (product of the Nippon Geon K.K.), and OCG-895i (product of OCG Microelectronics Material K.K.), instead, the results were the same as those of Example 1.

While there have been shown and described present preferred embodiments of the invention, it is to be distinctly understood that the invention is not limited thereto but may be otherwise variously embodied and practiced without departure from the spirit of this invention.

For example, the method for measuring the film thickness is not limited to that which is described in the examples cited above. A method which implements the measurement of the thickness by the use of a contact needle may be adopted instead. The resist to be used herein does not need to be limited to that which is described in the examples cited above. The method for the determination of baking conditions according to this invention can be applied equally effectively for positive resists (novolak type, high-molecular polymer type, chemical amplified type, etc.), positive-negative amphiprotic resists, and negative resists.

As described above, the method for determining the conditions for the formation of resist patterns according to this invention permits the optimum conditions for baking resist film to be determined infallibly with high accuracy through a small number of processes without relying on the conditions for exposure, the conditions for development, etc.

Further, since this invention bakes the resists under the optimum baking conditions which are determined in conformity with the accuracy (namely the choice between the shapes of patterns and the uniformity of critical dimensions) to be found by using as occasion demands the indexes for the resist baking conditions (baking temperature and baking time), it allows resist patterns of high accuracy to be formed in conformity with the accuracy to be sought as occasion demands.

This invention further allows the optimum baking and cooling conditions that optimize the accuracy of patterns to be determined with high accuracy.

The method for the formation of resist patterns according to this invention allows resist patterns of high accuracy to be formed while reconciling high quality of the shapes of patterns and the uniformity of critical dimensions by determining the optimum cooling conditions.

It should be understood that the invention is not limited to the particular embodiments shown and described herein, but that various changes and modifications may be made without departing from the spirit and scope of this novel concept as defined by the following claims.

What is claimed is:

1. A method of determining conditions for a resist pattern formation process having a baking operation which is carried out under a baking temperature and during a baking time, said method comprising the processes of:

assuming a particular condition in which, after trial resist films are formed on a plurality of trial plates and then baked under baking conditions which are different from one another, said trial resist films are subjected to a dissolving treatment without an exposing treatment under a predetermined treatment condition in which each of said trial resist films is partially dissolved;

determining, as said baking temperature, a temperature which minimizes a difference in a uniformity of remaining resist thickness of said trial resist films in said trial plates relative to differences in baking times for said trial resist films in said particular condition; and determining, as said baking time, a time which makes said uniformity be best under said baking temperature in said particular condition.

2. A method as claimed in claim 1, wherein resist pattern formation process comprises the processes of:

forming an actual resist film on an actual plate;

executing said baking operation to bake said actual resist film under said baking temperature and during said baking time;

cooling said actual resist film until room temperature after said executing process;

exposing said actual resist film to a predetermined pattern after said cooling process; and performing a developing treatment on said actual resist film after said exposing process.

3. A method as claimed in claim 2, wherein said actual resist film has a film residual amount after said performing process, said dissolving treatment having a condition in which each of said trial resist films has a remaining amount smaller than said film remaining amount.

4. A method as claimed in claim 2, wherein said actual resist film has a ratio of remaining thickness after said performing process, said dissolving treatment having a condition in which each of said trial resist films has a remaining ratio smaller than said film remaining ratio.

5. A method of determining conditions for a resist pattern formation process having a baking operation which is carried out under a baking temperature and during a baking time, said method comprising the processes of:

assuming a particular condition in which, after trial resist films are formed on a plurality of trial plates and then baked under baking conditions which are different from one another, said trial resist films are subjected to a dissolving treatment without an exposing treatment under a predetermined treatment condition in which each of said trial resist films is partially dissolved;

determining, as said baking temperature, a temperature which minimizes a difference in an amount of reducing thickness due to said dissolving treatment of said trial plates relative to differences in baking times for said trial resist films in said particular condition; and determining, as said baking time, a time which makes said reducing amount be smallest under said baking temperature in said particular condition.

6. A method as claimed in claim 5, wherein resist pattern formation process comprises the processes of:

forming an actual resist film on an actual plate;

executing said baking operation to bake said actual resist film under said baking temperature and during said baking time;

cooling said actual resist film until room temperature after said executing process;

exposing said actual resist film to a predetermined pattern after said cooling process; and performing a developing treatment on said actual resist film after said exposing process.

7. A method as claimed in claim 6, wherein said actual resist film has a film remaining amount after said performing process, said dissolving treatment having a condition in which each of said trial resist films has a residual amount smaller than said film remaining amount.

8. A method as claimed in claim 6, wherein said actual resist film has a film remaining ratio after said performing process, said dissolving treatment having a condition in which each of said trial resist films has a remaining ratio smaller than said film remaining ratio.

9. A method of determining conditions for a resist pattern formation process having a cooling operation which is carried out at a cooling condition, said method comprising the processes of:

assuming a particular condition in which, after trial resist films are formed on a plurality of trial plates and then baked under baking conditions which are different from one another, said trial resist films are subjected to a dissolving treatment without an exposing treatment under a predetermined treatment condition in which each of said trial resist films is partially dissolved; and determining, as said cooling condition, a condition which minimizes a difference between a first and a second baking temperature, said first baking temperature minimizing a difference in a uniformity of remaining thicknesses of said trial resist films in said trial plates relative to differences in baking times for said trial resist films in said particular condition, said second baking temperature minimizing a difference in a decreased amount of said trial resist films due to said dissolving treatment of said trial plates relative to differences in baking times for said trial resist films in said particular condition.

10. A method as claimed in claim 9, wherein resist pattern formation process comprises the processes of:

forming an actual resist film on an actual plate;

executing said baking operation to bake said actual resist film under said baking temperature and during said baking time;

cooling said actual resist film until room temperature after said executing process;

exposing said actual resist film to a predetermined pattern after said cooling process; and performing a developing treatment on said actual resist film after said exposing process.

11. A method as claimed in claim 10, wherein said actual resist film has a film remaining amount after said performing process, said dissolving treatment having a condition in which each of said trial resist films has a remaining amount smaller than said film remaining amount.

12. A method as claimed in claim 10, wherein said actual resist film has a film remaining ratio after said performing process, said dissolving treatment having a condition in which each of said trial resist films has a remaining ratio smaller than said film remaining ratio.

13. A method of determining a resist film cooling condition as a condition used on resist pattern formation, said method comprising the processes of:

preparing a plurality of trial plates on which trial resist films are formed, respectively;

baking said plates with said trial resist films under different baking conditions; and thereafter partially dissolving, without exposure, said trial resist films which are baked under the above-mentioned baking conditions, respectively;

deciding a first baking temperature at which a variation in uniformity of remaining thicknesses of said trial resist films on the trial plates is minimized in relation to variations among baking times of said baking conditions;

deciding a second baking temperature at which a variation of amounts of reducing thicknesses is minimized in relation to variations among said baking times when said trial resist films are dissolved; and determining, as said resist film cooling condition, a cooling condition such that a difference is minimized between said first and said second baking temperatures decided in the above-mentioned two deciding processes.

14. A method of forming a resist pattern, comprising the processes of:

assuming a particular condition in which, after trial resist films are formed on a plurality of trial plates and then baked under baking conditions which are different from one another, said trial resist films are subjected to a dissolving treatment without an exposing treatment under a predetermined treatment condition in which each of said trial resist films is partially dissolved;

determining a baking temperature which minimizes a difference in a uniformity of remaining thickness of said trial resist films in said trial plates relative to differences in baking times for said trial resist films in said particular condition;

determining a baking time which makes said uniformity be best under said baking temperature in said particular condition;

forming an actual resist film on an actual plate;

baking said actual resist film under said baking temperature and during said baking time;

cooling said actual resist film until room temperature after said baking process;

exposing said actual resist film to a predetermined pattern after said cooling process; and performing a developing treatment on said actual resist film after said exposing process.

15. A method as claimed in claim 14, wherein said actual resist film has a film remaining amount after said performing process, said dissolving treatment having a condition in which each of said trial resist films has a remaining amount smaller than said film remaining amount.

16. A method as claimed in claim 14, wherein said actual resist film has a film remaining ratio after said performing process, said dissolving treatment having a condition in which each of said trial resist films has a remaining ratio smaller than said film remaining ratio.

17. A method of forming a resist pattern, comprising the processes of:

assuming a particular condition in which, after trial resist films are formed on a plurality of trial plates and then baked under baking conditions which are different from one another, said trial resist films are subjected to a dissolving treatment without an exposing treatment under a predetermined treatment condition in which each of said actual trial resist films is partially dissolved;

determining a baking temperature which minimizes a difference in a reducing amount of said trial resist films due to said dissolving treatment of said trial plates relative to differences in baking times for said trial resist films in said particular condition;

determining a baking time which makes said reducing amount be smallest under said baking temperature in said particular condition;

forming an actual resist film on an actual plate;

baking said actual resist film under said baking temperature and during said baking time;

cooling said actual resist film until room temperature after said baking process;

exposing said actual resist film to a predetermined pattern after said cooling process; and performing a developing treatment on said actual resist film after said exposing process.

18. A method as claimed in claim 17, wherein said actual resist film has a film remaining amount after said performing process, said dissolving treatment having a condition in which each of said trial resist films has a remaining amount smaller than said trial film remaining amount.

19. A method as claimed in claim 17, wherein said actual resist film has a film remaining ratio after said performing process, said dissolving treatment having a condition in which each of said actual trial resist films has a remaining ratio smaller than said film remaining ratio.

20. A method of forming a resist pattern, comprising the processes of:

assuming a particular condition in which, after trial resist films are formed on a plurality of trial plates and then baked under baking conditions which are different from one another, said trial resist films are subjected to a dissolving treatment without an exposing treatment under a predetermined treatment condition in which each of said trial resist films is partially dissolved;

determining a cooling condition which minimizes a difference between a first and a second baking temperature, said first baking temperature minimizing a difference in a uniformity of remaining thickness of said trial resist films in said trial plates relative to differences in baking times for said trial resist films in said particular condition, said second baking temperature minimizing a difference in a reducing amount of said trial resist films due to said dissolving treatment of said trial plates relative to differences in baking tames for said trial resist films in said particular condition;

forming an actual resist film on an actual plate;

baking said actual resist film under said baking temperature and during said baking time;

cooling said actual resist film until room temperature after said baking process;

exposing said actual resist film to a predetermined pattern after said cooling process; and performing a developing treatment on said actual resist film after said exposing process.

21. A method as claimed in claim 20, wherein said actual resist film has a film remaining amount after said performing process, said dissolving treatment having a condition in which each of said trial resist films has a remaining amount smaller than said film remaining amount.

22. A method as claimed in claim 20, wherein said actual resist film has a film remaining ratio after said performing process, said dissolving treatment having a condition in which each of said trial resist films has a remaining ratio smaller than said film remaining ratio.

23. A method of forming a resist pattern on the basis of a particular condition, said method comprising the processes of:

preparing a plurality of trial plates on which trial resist films are formed, respectively;

baking the plurality of said plates with said trial resist films under different baking conditions;

thereafter partially dissolving, without exposure, said trial resist films which are baked under the above-mentioned baking conditions, respectively;

deciding a first baking temperature at which a variation in uniformity of remaining thicknesses of said trial resist films on said trial plates is minimized in relation to variations among baking times of said baking conditions;

deciding a second baking temperature at which a variation of amounts of reducing thicknesses is minimized in relation to variations among said baking times when said trial resist films are dissolved;

determining, as said particular condition, a cooling condition such that a difference is minimized between said first and said second baking temperatures;

forming and baking an actual resist film at said baking temperature during said baking time;

cooling said actual resist film to said room temperature after said baking process;

thereafter exposing said actual resist film to a predetermined pattern; and then developing said actual resist film.

* * * * *